United States Patent [19]

Boning et al.

[11] 4,408,289

[45] Oct. 4, 1983

[54] SIMPLIFIED MONITORING APPARATUS FOR SENSORS IN MOTOR VEHICLES

[75] Inventors: Bernward Boning, Ludwigsburg; Rainer Bone, Vaihingen; Rudolf Nagel, Asperg; Jens-Detlef Rubrecht, Braunschweig, all of Fed. Rep. of Germany

[73] Assignee: Robert Bosch GmbH, Stuttgart, Fed. Rep. of Germany

[21] Appl. No.: 218,343

[22] Filed: Dec. 22, 1980

[30] Foreign Application Priority Data

Feb. 22, 1980 [DE] Fed. Rep. of Germany ....... 3006599

[51] Int. Cl.$^3$ ............................................. H03K 5/20
[52] U.S. Cl. ................................... 364/551; 307/234; 340/658
[58] Field of Search ....................... 364/551, 424, 426; 324/78 D, 78 R, 78 Z, 79 D, 79 R; 307/234, 518, 522, 471; 340/658, 661

[56] References Cited

U.S. PATENT DOCUMENTS

| | | | |
|---|---|---|---|
| 3,600,688 | 8/1971 | Booth | 307/234 |
| 3,778,727 | 12/1973 | Williams | 307/234 |
| 3,803,599 | 4/1974 | McLean et al. | 307/522 |
| 3,906,379 | 9/1975 | Tuhro | 307/234 |
| 3,943,382 | 3/1976 | Hermansdorfer et al. | 307/234 |
| 3,950,705 | 4/1976 | Fuerherm | 307/471 |
| 4,031,464 | 6/1977 | Norberg | 324/78 Z |
| 4,070,618 | 1/1978 | Thomas | 324/78 D |
| 4,072,927 | 2/1978 | O'Neil | 340/658 |
| 4,222,045 | 9/1980 | Cholin | 340/658 |

*Primary Examiner*—Gary Chin
*Attorney, Agent, or Firm*—Frishauf, Holtz, Goodman & Woodward

[57] ABSTRACT

The leading edge of each pulse of an incoming signal sequence starts a first monostable multivibrator whose period is equal to the period of the pulse sequence when the pulse sequence has the desired frequency. The input signal sequence and the output signal from the multivibrator are applied to two inputs of an exclusive OR gate. The latter furnishes an output signal corresponding to the difference in pulse width between the signal applied to the two inputs. The leading edge of the difference signal then starts a second monostable multivibrator whose pulse width corresponds to the maximum allowable frequency deviation. The output signal of the second monostable multivibrator is applied to an inverting input of an AND gate. The direct input of the AND gate receives the difference signal. The AND gate, therefore, only furnishes an output signal when the difference signal has a greater pulse width than the output signal of the second multivibrator, i.e. when the frequency deviation in the incoming signal sequence exceeds the maximum permissible frequency deviation.

8 Claims, 2 Drawing Figures

SIMPLIFIED MONITORING APPARATUS FOR SENSORS IN MOTOR VEHICLES

CROSS-REFERENCE TO RELATED APPLICATIONS AND PUBLICATIONS

U.S. Pat. No. 4,152,655, Przybyla corresponding to German Disclosure Document DE-OS No. 26 44 646 assigned to the same assignee.

The present invention relates to systems for monitoring sensors in automotive vehicles. In particular, it relates to monitoring systems which determine when the frequency of a sensor output signal differs from a desired frequency by more than a predetermined maximum allowable deviation.

BACKGROUND OF THE INVENTION

In monitoring apparatus described in U.S. Pat. No. 4,152,655 each new pulse in the pulse sequence being monitored (input signal sequence) starts the countdown of a counter from a preset value at a frequency substantially higher than the input signal frequency. The count on the counter at receipt of the next input pulse is a measure of the actual input signal frequency and therefore can be used to determine the deviation of the input signal frequency from a desired input signal frequency. This type of apparatus requires a great deal of equipment. Because of this, its usefulness in monitoring sensors in a motor vehicle is quite limited. This type of apparatus has the further disadvantage that, when a microprocessor is used, a great many storage locations are required.

THE INVENTION

It is an object of the present invention to furnish monitoring equipment which utilizes only four logic blocks and is therefore considerably less expensive than the known equipment. Further, the storage requirements in a microprocessor are to be greatly decreased.

In accordance with the present invention, a monostable multivibrator is provided to generate a first timing signal in response to each of the leading edges of the input signals, the timing signals having a width corresponding to the width of the input signals at the desired input signal frequency. An exclusive OR gate, is provided to furnish a difference signal having a width corresponding to the difference between the width of the input signal and the width of the first timing signal. The difference signal is applied to a second multivibrator which generates a second timing signal. The second timing signal has a width corresponding to the maximum allowable frequency deviation of the input signal sequence from the desired input signal frequency. An AND gate having one inverting input, receive the second timing signal at the inverting input and the difference signal and furnishes an output signal indicative of malfunction of the equipment when the width of the difference signal exceeds the width of the second timing signal.

It will be noted that only four logic elements are required, namely the first and second monostable multivibrator, and an exclusive OR gate and an AND gate. The first monostable multivibrator provides a reference for the desired input signal frequency, while the other determines the maximum allowable frequency deviation.

DESCRIPTION OF THE PREFERRED EMBODIMENT

Figure 1:
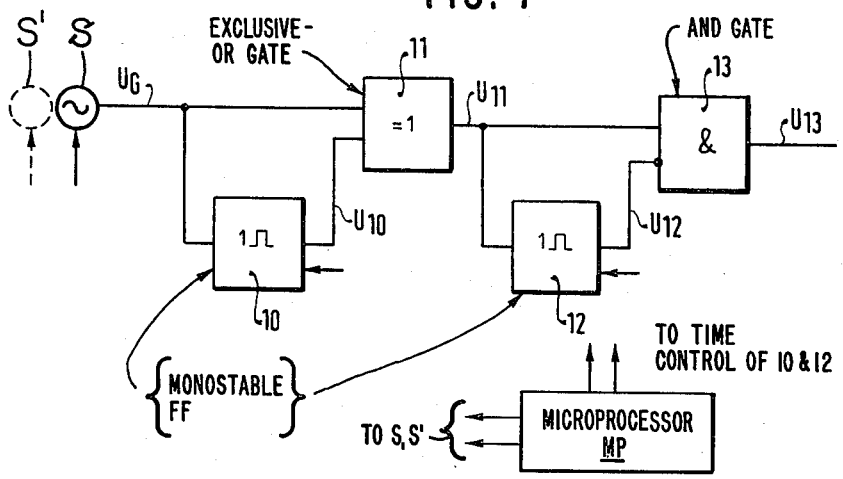
FIG. 1 is a block diagram illustrating the monitoring system of the present invention.
Figure 2:
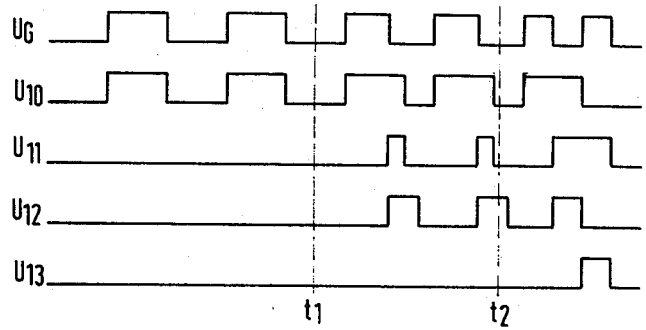
FIG. 2 shows the wave forms with respect to time at different points in the circuit of FIG. 1.

The signal from an automotive sensor forming an input signal sequence is shown by $U_G$ in FIG. 2 and appears on a connecting line, as illustrated in FIG. 1. The signal for example, may be the knock signal. If the sensor is operating properly, the signals occur in a known frequency range. If the frequency of the input signal is outside of this range, the sensor is malfunctioning, i.e., either the sensor itself or one of the lines connecting it to the circuit is damaged.

The signal $U_G$ derived from a sensor S which, in effect, is a signal generator, is applied to one input of an exclusive OR gate 11 and further to the input of a monostable multivibrator 10. The output of monostable flip flop (FF) or, multivibrator 10 forms a time reference signal which is applied to another input of an exclusive OR gate 11. The output of exclusive OR gate 11 is connected directly to one input of an AND gate 13. It is further connected to the input of a second monostable multivibrator or FF 12. The output of monostable multivibrator 12 is connected to an inverting input of AND gate 13. The output of AND gate 13, $U_{13}$, constitutes the output signal of the present invention, that is, the signal indicating the malfunction of the sensor furnishing signal $U_G$.

OPERATION

With reference to the wave forms in FIG. 2: The first line in FIG. 2 indicates the input signal sequence $U_G$. Up to a time $t_1$, this frequency is the desired input signal frequency. From time $t_1$ to $t_2$, the input signal frequency increases above the desired frequency but is still within the allowable deviation. After time $t_2$ the frequency of the signal $U_G$ increases until it is beyond this allowable deviation. The signal $U_{10}$, that is the time reference signal at the output of monostable multivibrator 10, is illustrated in the second line of FIG. 2. This signal has a width which corresponds to the width of the input signals at the desired frequency. It is used to compare the actual frequency of signal $U_G$ to the desired frequency. Specifically, exclusive OR gate 11 furnishes an output signal when and only when a positive signal appears at only one of its input. Thus, when the pulse width (frequency) of signal $U_G$ is equal to the width of pulses $U_{10}$ i.e., when monostable FF is in the ON-state, there is no output from exclusive OR gate 11. However, an increase in the frequency of input signal sequence $U_G$ causes a decrease in its pulse width. As shown in line 3 of FIG. 2, a difference or duration or compared signal $U_{11}$ appears at the output of exclusive OR gate 11. The leading edge of this signal starts monostable multivibrator 12 to change to the ON state. The output $U_{12}$ of monostable multivibrator 12 forms a duration output signal which is illustrated in the fourth line of FIG. 2. Since it is applied to the inverting input of AND gate 13, there will be no output from this AND gate unless the signal $U_{11}$ has a pulse width exceeding that of signal $U_{12}$. The pulse width of the signal $U_{12}$ corresponds to the maximum allowable frequency duration of signal $U_G$ from a desired frequency. This is the case illustrated after time $t_2$. The pulse width of signal $U_{11}$ then exceeds that of signal $U_{12}$ and, therefore, AND gate $U_{13}$ furnishes the output signal which indicates sensor malfunction.

Thus, exclusive OR gate 11 is used to compare the actual frequency to the desired frequency and AND gate 13 then furnishes an output signal when the frequency deviation of the input signal sequence exceeds a maximum allowable frequency deviation.

When the above-described circuit is used to monitor the sensors in a motor vehicle, it is not necessary that this monitoring takes place continuously. A periodic monitoring of the sensors is generally sufficient. For example, the monitoring may take place once per revolution of the engine or may take place when the vehicle is being started. For such intermittent monitoring, a microprocessor MP is particularly useful. Also, a microprocessor is particularly suitable for this application since its sequence and memory capability may accommodate many different time constants of the monostable FF's 10 and 12 so that a plurality of sensors S, S may be monitored in a multiplex mode.

Various changes and modifications may be made within the scope of the inventive concepts.

We claim:

1. Apparatus for generating an output signal ($U_{13}$) indicative of malfunction of a signal generator (S, S') which, under normal operating conditions, generates a sequence of periodically repetitive input signals having a leading edge, and a signal width varying inversely with frequency, comprising
   an exclusive OR gate (11);
   a first monostable multivibrator (10) having an ON time corresponding to the signal duration of any one of the input signals under normal operation, and providing a time reference signal ($U_{10}$);
   a second monostable multivibrator (12) having an ON time corresponding to the permitted variation from normal operation to the signal duration of any one of the input signals;
   and a coincidence gate (AND 13);
   wherein the input signals from the signal generator (S,S') are connected to the frist monostable multivibrator (10) to trigger said multivibrator and to provide said time reference signals;
   the input signals and the time reference signals are connected to the exclusive-OR gate (11) to provide compared output signals ($U_{11}$) having a time duration representative of the deviation of the input signals ($U_G$) from the time reference signals ($U_{10}$);
   said compared time reference signals are connected to trigger the second monostable multivibrator (12), said second monostable multivibrator providing deviation output signals ($U_{12}$) having a leading edge corresponding to the leading edge of the time reference signals and a time duration as determined by said permitted variation;
   and wherein the deviation output signals ($U_{12}$) and compared output signals ($U_{11}$) are connected to said coincidence gate (13) for comparison if the compared output signals have a time duration falling below, or above the time duration of the deviation output signals from the second monostable multivibrator (12),
   said coincidence gate providing an output indicative of proper operation if the comparison indicates that the time duration of the compared output signals ($U_{11}$) is less than that of the deviation output signals ($U_{12}$) while providing an output indicative of malfunction or improper operation if the compared output signals ($U_{11}$) are equal to or longer than said deviation output signals ($U_{12}$).

2. Apparatus according to claim 1, wherein said signal generator (S) comprises an automotive vehicle engine knock signal generator.

3. Apparatus according to claim 1 wherein said coincidence gate comprises an AND gate (13) having an inverting input.

4. Apparatus according to claim 3, wherein the AND gate has its direct input connecting to the exclusive OR gate (11) and its inverting input connected to the second monostable multivibrator (12).

5. Apparatus according to claim 1, wherein a plurality of signal generators (S, S') are provided;
   and sequencing means (MP) are provided, connecting the signals from the respective generators to the exclusive OR gate (11) (10) in multiplex mode.

6. Apparatus according to claim 5 wherein said signal generator (S) comprises automotive vehicle engine knock signal generators.

7. Apparatus according to claim 2 wherein said coincidence gate comprises an AND gate (13) having an inverting input.

8. Apparatus according to claim 6 wherein said coincidence gate comprises an AND gate (13) having an inverting input.

* * * * *